United States Patent
Zou et al.

(10) Patent No.: US 10,741,718 B2
(45) Date of Patent: Aug. 11, 2020

(54) LASER DE-BOND CARRIER WAFER FROM DEVICE WAFER

(71) Applicant: Lumileds LLC, San Jose, CA (US)

(72) Inventors: Quanbo Zou, Eindhoven (NL); Salman Akram, Eindhoven (NL); Jerome Chandra Bhat, Eindhoven (NL); Minh Ngoc Trieu, Eindhoven (NL); Robert Blank, Eindhoven (NL)

(73) Assignee: LUMILEDS, LLC, San Jose, CA (US)

( * ) Notice: Subject to any disclaimer, the term of this patent is extended or adjusted under 35 U.S.C. 154(b) by 0 days.

(21) Appl. No.: 14/423,162

(22) PCT Filed: Aug. 12, 2013

(86) PCT No.: PCT/IB2013/056588
§ 371 (c)(1),
(2) Date: Feb. 23, 2015

(87) PCT Pub. No.: WO2014/037829
PCT Pub. Date: Mar. 13, 2014

(65) Prior Publication Data
US 2015/0228849 A1    Aug. 13, 2015

Related U.S. Application Data

(60) Provisional application No. 61/696,943, filed on Sep. 5, 2012.

(51) Int. Cl.
*H01L 33/00* (2010.01)
*H01L 21/768* (2006.01)
(Continued)

(52) U.S. Cl.
CPC .... *H01L 33/0079* (2013.01); *H01L 21/76894* (2013.01); *H01L 21/78* (2013.01);
(Continued)

(58) Field of Classification Search
None
See application file for complete search history.

(56) References Cited

U.S. PATENT DOCUMENTS

| 5,656,548 A * | 8/1997 | Zavracky | H01L 23/49833 |
| | | | 148/DIG. 164 |
| RE38,466 E * | 3/2004 | Inoue | G02F 1/1368 |
| | | | 438/158 |

(Continued)

FOREIGN PATENT DOCUMENTS

| CN | 101005110 A | 7/2007 |
| CN | 101465402 A | 6/2009 |

(Continued)

*Primary Examiner* — Moazzam Hossain
*Assistant Examiner* — Stanetta D Isaac
(74) *Attorney, Agent, or Firm* — Volpe and Koenig, PC.

(57) ABSTRACT

In one embodiment, a semiconductor device wafer (10) contains electrical components and has electrodes (28) on a first side of the device wafer (10). A transparent carrier wafer (30) is bonded to the first side of the device wafer (10) using a bonding material (32) (e.g., a polymer or metal). The second side of the device wafer (10) is then processed, such as thinned, while the carrier wafer (30) provides mechanical support for the device wafer (10). The carrier wafer (30) is then de-bonded from the device wafer (10) by passing a laser beam (46) through the carrier wafer (30), the carrier wafer (30) being substantially transparent to the wavelength of the beam. The beam impinges on the bonding material (32), which absorbs the beam's energy, to break the chemical bonds between the bonding material (32) and the carrier wafer (30). The released carrier wafer (30) is then removed from the device wafer (10), and the residual bonding material is cleaned from the device wafer (10).

16 Claims, 4 Drawing Sheets

(51) Int. Cl.
  *H01L 21/78* (2006.01)
  *H01L 23/00* (2006.01)
  *H01L 25/00* (2006.01)
  *H01L 25/16* (2006.01)
(52) U.S. Cl.
  CPC .............. *H01L 24/83* (2013.01); *H01L 25/50* (2013.01); *H01L 25/167* (2013.01); *H01L 2224/81205* (2013.01); *H01L 2224/8385* (2013.01); *H01L 2224/83805* (2013.01); *H01L 2924/0002* (2013.01); *H01L 2924/12041* (2013.01); *H01L 2924/12042* (2013.01)

(56) References Cited

U.S. PATENT DOCUMENTS

| | | | |
|---|---|---|---|
| 2002/0115265 A1* | 8/2002 | Iwafuchi | H01L 21/67092 438/458 |
| 2005/0233504 A1 | 10/2005 | Doi et al. | |
| 2006/0264004 A1* | 11/2006 | Tong | H01L 21/76254 438/455 |
| 2008/0096365 A1* | 4/2008 | Chitnis | H01L 33/0079 438/455 |
| 2008/0315427 A1 | 12/2008 | Seko | |
| 2010/0155936 A1 | 6/2010 | Codding et al. | |
| 2010/0186883 A1* | 7/2010 | Tomoda | H01L 25/0753 156/220 |
| 2010/0330788 A1* | 12/2010 | Yu | H01L 21/187 438/514 |
| 2011/0001155 A1 | 1/2011 | Hsu | |
| 2012/0115262 A1 | 5/2012 | Menard et al. | |
| 2014/0061949 A1* | 3/2014 | Enquist | H01L 21/6835 257/777 |
| 2014/0311680 A1 | 10/2014 | Kubo et al. | |

FOREIGN PATENT DOCUMENTS

| | | |
|---|---|---|
| CN | 102106001 A | 6/2011 |
| CN | 102214756 A | 10/2011 |
| EP | 0924769 A1 | 6/1999 |
| EP | 2262012 A2 | 12/2010 |
| EP | 2378553 A1 | 10/2011 |

\* cited by examiner

LASER DE-BOND CARRIER WAFER FROM DEVICE WAFER

CROSS-REFERENCE TO PRIOR APPLICATIONS

This application is the U.S. National Phase application under 35 U.S.C. § 371 of International Application No. PCT/IB2013/056588, filed on Aug. 12, 2013, which claims the benefit of U.S. Patent Application No. 61/696,943, filed on Sep. 3, 2012. These applications are hereby incorporated by reference herein.

FIELD OF THE INVENTION

This invention relates to semiconductor wafer fabrication and, in particular, to a process for de-bonding a carrier wafer from a device wafer containing electrical components, where the carrier wafer provides temporary mechanical support for the device wafer during processing of the device wafer.

BACKGROUND

Although the invention applies to the fabrication of virtually any type of semiconductor device wafer, an example of fabricating a light emitting diode (LED) wafer is presented.

Gallium nitride based LEDs, such as for generating blue light, are manufactured by epitaxially growing semiconductor layers over a growth substrate (a wafer), such as sapphire. An active layer between p-type and n-type layers emits light having a peak wavelength, and the peak wavelength is determined by the material composition of the active layer. Such semiconductor layers may be on the order of a few tens of microns thick and very brittle. Metallization and other well-known processes are then performed on the LED wafer to, for example, remove the growth substrate, thin the LED layers, and form electrodes. The LED wafer is subsequently diced to form LED chips for packaging.

In cases where the growth substrate is to be removed from the LED wafer, such as to perform processes on the LED layers facing the growth substrate, or in cases where the growth substrate is to be thinned, such as for scribe and break singulation, a carrier wafer must be first bonded to the opposite surface of the LED wafer to provide mechanical support of the thin LED layers during removal or thinning of the growth substrate. After the carrier wafer is bonded to the LED wafer and the growth substrate is removed or thinned, any exposed LED layers may be further processed, such as thinning the LED layers and depositing thin films over the exposed LED layers. The carrier wafer may be connected temporarily or permanently. If the carrier wafer is temporary, methods have to be performed to de-bond the carrier wafer from the LED wafer. Silicon carrier wafers are commonly used due to their low cost and well-known characteristics. A silicon carrier wafer absorbs light from the LED and should be ultimately removed from the LED layers.

Using a carrier wafer (typically silicon) for mechanical support is commonly used in integrated circuit processes, especially where IC wafers are stacked to form three-dimensional (3-D) modules and conductive vias extend vertically though the IC wafers. Typically, the carrier wafer is bonded to the IC wafer using an intermediate-temperature (e.g., up to 250° C.) polymer adhesive so that the adhesive does not release at the expected IC wafer process temperatures. After the IC wafer processing is completed, de-bonding of the carrier wafer is performed at a high heat and with special tools and techniques (e.g., using Brewer Science's HT1010™ thermal-sliding de-bond process).

It is also known to apply a special light-to-heat conversion (LTHC) layer over a carrier wafer, then bond the carrier wafer to the device wafer using a special adhesive that melts at a relatively low temperature. A laser beam is then used to heat up the LTHC layer, which, in turn, melts the adhesive for de-bonding the carrier wafer. The LTHC material, special adhesive materials (e.g., 3M's LC3200 and LC5200), and special tools are available from 3M Company. The process is relatively expensive and time-consuming. Since the adhesive needs to melt at a relatively low temperature (the 3M adhesive is rated only up to 180° C.), the de-bonding process is not suitable when quality thin films need to be deposited, since such thin films typically need to be deposited at over 250° C.

In some processes for forming high quality thin films, such as a PECVD process, the process temperature is substantially greater than 250° C. The polymers used for temporarily bonding the carrier wafer to the IC or LED wafer must therefore be very high temperature polymers (e.g., >350° C.), requiring more complex and higher temperature de-bonding processes and tools.

What is needed is an improved technique for de-bonding a carrier wafer from a device wafer that is simpler than the prior art processes. It is preferable that the de-bonding process works with commonly used bonding layer materials, including high temperature polymers (e.g., BCB, PBO, polyimides, etc.), intermediate temperature polymers/adhesives (e.g., Brewer Science's HT1010™, 3M's LC3200/LC5200, etc.), low temperature glues/adhesives, and even metal (e.g., eutectic alloy) bonding materials.

SUMMARY

Instead of a light absorbing carrier wafer, such as silicon, a transparent carrier wafer is used, such as a sapphire or SiC wafer. In the example of an LED wafer process, the carrier wafer is bonded to the LED wafer opposite the side that is supported by the growth substrate. The bonding material is typically a conventional polymer adhesive, such as a polymer that is stable up to 350° C. The growth substrate is then removed from the LED wafer, and the exposed LED layers are further processed. Such further processing may include thinning, depositing thin films, forming vias, etc. The growth substrate may be thinned instead of removed. The device wafer may be any wafer containing circuitry.

For de-bonding the carrier wafer from the LED wafer, a laser beam is scanned over the carrier wafer, where the carrier wafer is substantially transparent to the wavelength of light from the laser beam. The polymer adhesive directly absorbs the laser beam energy, and the energy breaks the polymer-carrier chemical bonds, rather than simply melting the polymer through heat. There is no light-to-heat conversion (LTHC) layer used, so special materials are not needed. The laser is not strong enough to damage any structures within the LED wafer. In one embodiment, a 248 nm laser is used. A near-UV or blue laser may also be used. In another embodiment, a UV laser emitting a peak wavelength of 193 nm with an energy intensity of 800 mJ/cm$^2$ (40 W/cm$^2$) is used to de-bond a benzocyclobutene (BCB) polymer adhesive that is stable up to 350° C.

Accordingly, the adhesive does not require heat to be released so can be an adhesive that is stable at sufficiently high temperatures for thin film processing.

After the removal of the carrier wafer, the de-bonded surface of the LED wafer is then cleaned of the residual adhesive.

In another embodiment, a metal layer, such as a suitable eutectic metal alloy layer, is deposited on both the device wafer and the transparent carrier wafer (e.g., sapphire). The wafers are then bonded together under heat and pressure without any additional adhesive. A laser beam is then scanned through the carrier wafer, where the laser energy breaks the chemical bonds between the metal layer and the transparent carrier wafer, which de-bonds the carrier wafer from the metal layer. The metal layers remaining on the device wafer may then be etched/cleaned before singulation. In some cases, the metal layers may be used as a reflector and/or an electrode for the device wafer and does not need to be removed before singulation.

The de-bonding technique may also be applied to other types of bonding techniques/materials, such as anodic bonding, fusion bonding, frit glass bonding, etc.

The de-bonding process may be used for any type of IC wafer and is not limited to LED applications. All such wafers are referred to herein as device wafers.

Various other examples of processes are also described, such as a process for forming conductive vias through wafers for three-dimensional modules.

BRIEF DESCRIPTION OF THE DRAWINGS

FIG. 8 is similar to FIG. 2, where a transparent carrier wafer is bonded to the device wafer. The device wafer may be an LED wafer or any IC wafer.

FIG. 9 illustrates the device wafer having its growth substrate removed (if appropriate), followed by the device wafer being further processed (e.g., thinned), followed by another wafer being bonded to the exposed surface by a polymer adhesive.

FIG. 10 illustrates a laser beam scanning through the transparent carrier wafer and its energy being absorbed by the polymer adhesive to break the chemical bonds between the polymer and the carrier wafer.

FIG. 11 illustrates the de-bonded carrier wafer removed and the remaining polymer adhesive removed.

FIG. 12 illustrates via holes etched through the remaining device wafer, where the via holes are then coated with a dielectric and filled with a conductive material. A patterned electrode layer is then formed for terminating the conductive vias. The vias create conductive paths between opposing surfaces of the device wafer. The upper wafer bonded to the device wafer may contain transient voltage suppression (TVS) circuitry (e.g., ESD protection circuitry) or control circuitry for the devices on the device wafer. The resulting 3-D module is then singulated, as previously described with respect to FIG. 7.

FIG. 13 illustrates metal (including alloys) layers deposited on the device wafer and the transparent carrier wafer and the metal layers being bonded together using heat and pressure.

FIG. 14 illustrates a laser beam scanning through the carrier wafer to break the bonds between the deposited metal layer and the carrier wafer.

FIG. 15 illustrates the device wafer after the carrier wafer has been removed.

Elements that are the same or equivalent are labeled with the same numeral.

DETAILED DESCRIPTION

Figure 1:
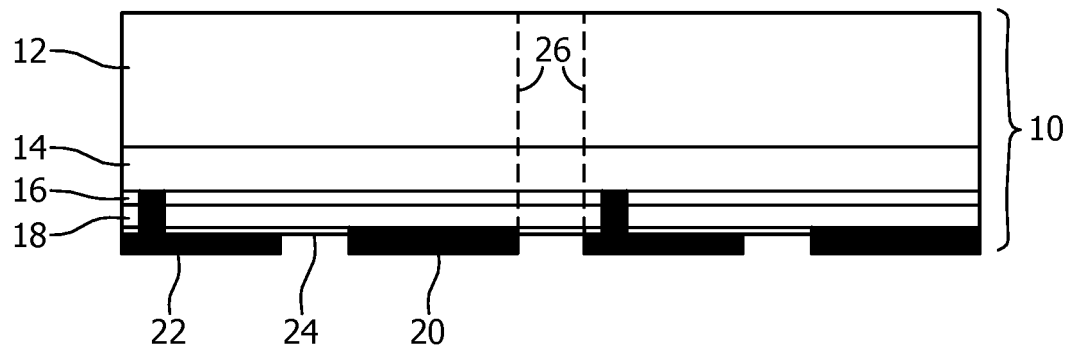
FIG. 1 is a cross-sectional view of a small portion of a prior art LED wafer, including a growth substrate, showing two LED areas for simplicity. The LED wafer is hereinafter referred to as a device wafer, since the de-bonding process may be performed with any type of wafer.

FIG. 1 is a cross-sectional view of a small portion of a prior art device wafer 10, which may include LEDs or any IC devices. The device wafer 10 may initially include a growth substrate 12, such as a silicon wafer (for an IC wafer) or a sapphire or SiC wafer (for a GaN based LED wafer). In the example of FIG. 1, the device wafer 10 is an LED wafer, where only two LED areas of the LED wafer are shown for simplicity. There may be thousands of LED areas on a single LED wafer, where each LED area is on the order of 1 mm$^2$.

The device wafer 10 includes an n-type layer 14, an active layer 16 that emits light, and a p-type layer 18. A p-metal electrode 20 contacts the p-type layer 18, and an n-metal electrode 22 contacts the n-type layer 14. A dielectric layer 24 insulates the n-metal electrode 22 from the p-type layer 18 and active layer 16. A singulation area is shown between dashed lines 26.

Since the inventive method is applicable to LED wafers as well as any type of IC wafer, the device wafer 10 has been simplified in the remaining figures to only show certain conductors in the device wafer 10. The device wafer 10 will typically comprise semiconductor material.

Figure 2:
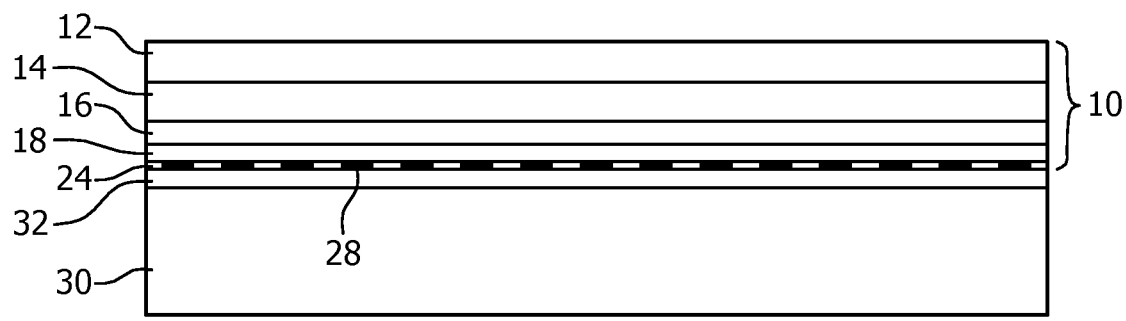
FIG. 2 illustrates a larger portion of the device wafer of FIG. 1 and eliminates detail of the LEDs for simplicity. A transparent carrier wafer is bonded to the device wafer using a polymer adhesive that absorbs UV or blue laser light.

FIG. 2 illustrates a larger portion of the device wafer 10. Electrodes 28 are shown at the bottom of the device wafer 10. The electrodes 28 may correspond to electrodes 20 and 22 in FIG. 1. Each device in the device wafer 10 may have any number of electrodes. A transparent carrier wafer 30 is bonded to the device wafer 10 using a light absorbing polymer adhesive 32. The adhesive 32 may be coated on either the device wafer 10 or the carrier wafer 30, then the two wafers are pressed together while the adhesive 32 is cured. Curing may be by UV, heat, cooling, or other process. Since a laser beam will eventually be used to break the chemical bonds between the adhesive 32 and the carrier wafer 30, the carrier wafer 30 is selected to be substantially transparent to the laser beam peak wavelength, and the adhesive 32 is selected to absorb a substantial portion of the beam's energy. In one embodiment, the carrier wafer 30 is sapphire or SiC. The adhesive 32 may be a high temperature (>350° C.) polymer such as benzocyclobutene (BCB), polybenzoxazole (PBO), Brewer Science's HT1010™ adhesive (stable up to 240° C.), a thermal tape, epoxy, silicone, or a polyimide.

The carrier wafer 30 provides mechanical support for the device wafer 10 during subsequent processing of the device wafer 10. In one embodiment, all wafers used are 6 inch wafers, although any size wafers may be used. Standard fabrication tools may be used to handle the carrier wafer 30.

Figure 3:
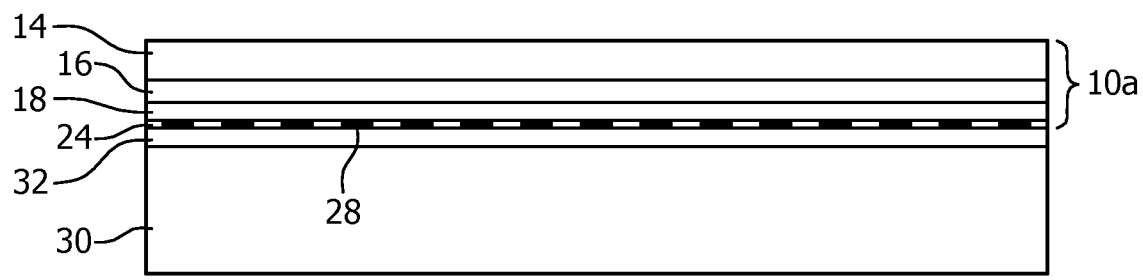
FIG. 3 illustrates the structure of FIG. 2 after the growth substrate is removed (if appropriate for the device wafer) and after the exposed device wafer is thinned or otherwise further processed.

FIG. 3 illustrates device wafer 10 after processing, resulting in the device wafer 10a. In the example, the growth substrate 12 is removed by etching, grinding, or laser lift-off, and the remaining device wafer 10 is thinned to a few tens of microns or less by grinding, polishing, chemical wet etching, or reactive ion etching (RIE). The thickness of the device wafer 10a may be in the range of 5-400 microns and preferably 20-200 microns. Other processes may be performed on the device wafer 10a. The carrier wafer 30 is necessary to provide mechanical support of the thin device wafer 10a so the processes may be performed using standard wafer fabrication tools.

In one example, conductive vias are formed to provide an electrical path through the device wafer 10a. The conductive vias may be used for stacking wafers in a 3-D module, where electrodes on opposing wafer surfaces align and are in electrical contact with each other.

Figure 4:
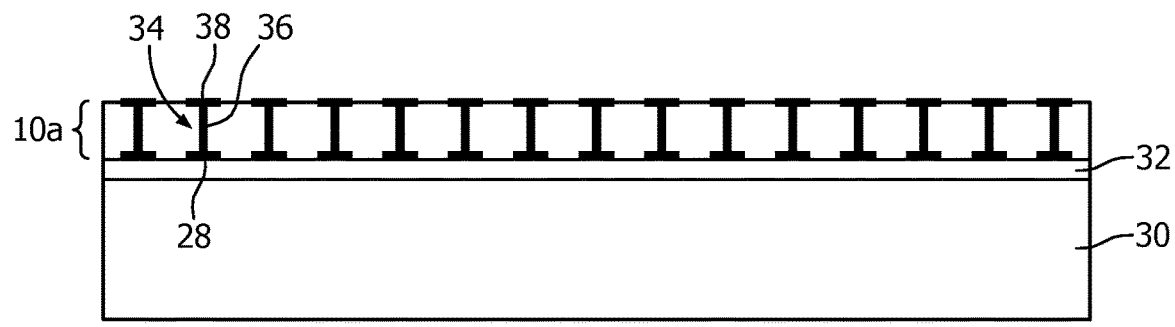
FIG. 4 illustrates via holes etched through the remaining device wafer, where the via holes are then coated with a dielectric and filled with a conductive material. A patterned electrode layer is then formed for terminating the conductive vias. The vias create conductive paths between opposing surfaces of the device wafer.

FIG. 4 illustrates via holes 34 etched through the remaining device wafer 10a, such as by masking followed by RIE. The via holes 34 are then coated with a dielectric, using well-known processes. If the device wafer 10a is silicon, the dielectric is silicon dioxide. Suitable dielectrics and their deposition methods are well known for other device wafer 10a materials.

The insulated via holes 34 then filled with a conductive material 36, such as polysilicon, copper, aluminum, or any other suitable metal or alloy. The conductive material 36 may be deposited by sputtering, plating, or other process.

A metal electrode layer is then deposited and patterned over the exposed surface to form electrodes 38 contacting the conductive material 36 in filing via holes 34. The electrodes 38 may comprise gold or other suitable metal, including alloys. Thus, a conductive path is formed between opposing surfaces of the device wafer 10a. In the alternative conductive material 36 may only fill a portion of via holes 34.

Figure 5:
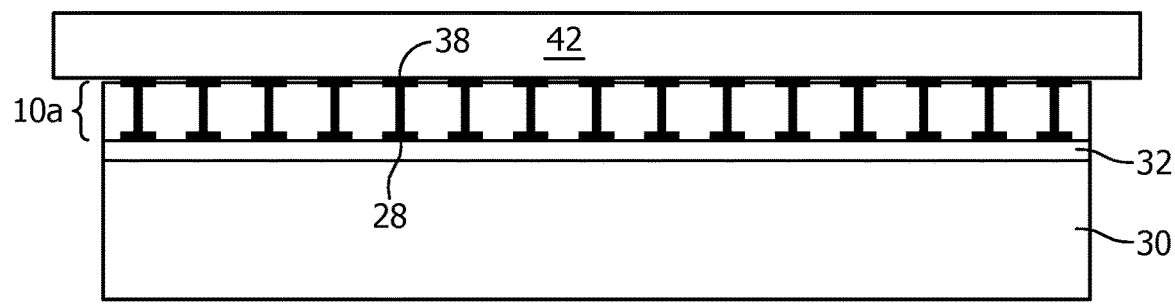
FIG. 5 illustrates a stretchable tacky tape affixed to a surface of the device wafer.

FIG. 5 illustrates a stretchable tacky tape 42 affixed to a surface of the device wafer 10a, which is used to support the dies after singulation, described later.

Figure 6:
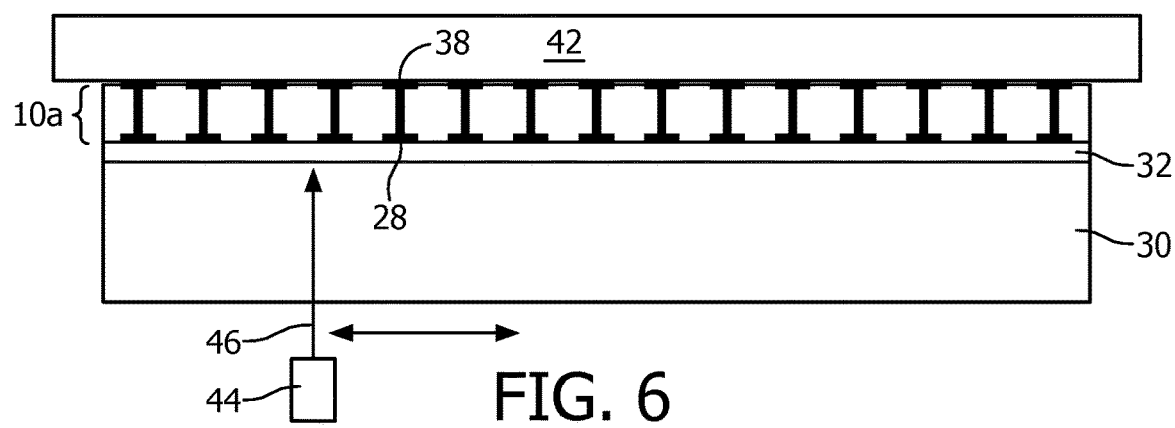
FIG. 6 illustrates a laser beam scanning through the transparent carrier wafer and its energy being absorbed by the polymer adhesive to break the chemical bonds between the polymer and the carrier wafer.

FIG. 6 illustrates a laser 44 generating a laser beam 46 that is X-Y scanned (or stepped) through the transparent carrier wafer 30 using conventional scanning optics (e.g., lenses, mirrors, prisms, etc.). The beam energy is absorbed by the adhesive 32 but not the carrier wafer 30. The absorbed energy breaks the chemical bonds between the polymer adhesive 32 and the carrier wafer 30. In one embodiment, the carrier wafer 30 is sapphire, and a 248 nm laser 44 is used. A near-UV or blue laser may also be used. In another embodiment, a UV laser emitting a peak wavelength of 193 nm with an energy intensity of 800 mJ/cm$^2$ (40 W/cm$^2$) is used to de-bond a benzocyclobutene (BCB) polymer adhesive 32 that is stable up to 350° C. The de-bonding process for a 6-inch diameter wafer will typically take between 5-10 minutes, depending on scan speed, beam energy, beam area, adhesive characteristics, etc. Much shorter de-bonding times are expected with optimized process parameters. The inventors have successfully de-bonded the carrier wafer 30 with adhesives 8-100 microns thick.

The released carrier wafer 30 is then lifted off the device wafer 10a, such as using a mechanical tool or other means. In one embodiment, gas is released from the adhesive 32 during the absorption of energy and forces the carrier wafer 30 away from the device wafer 10a.

Figure 7:
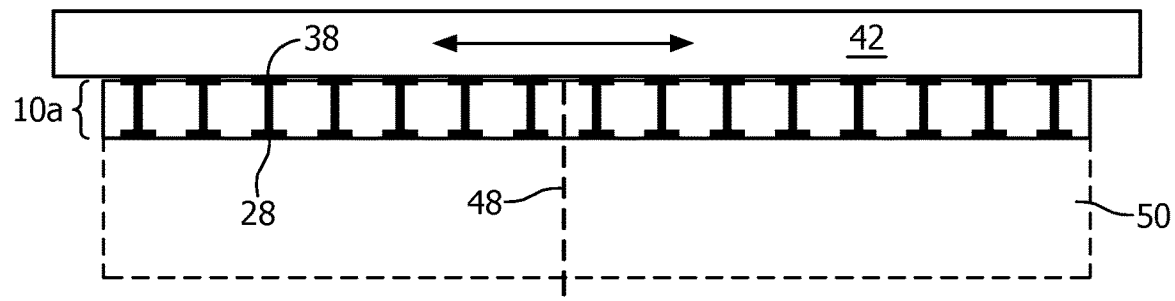
FIG. 7 illustrates the de-bonded carrier wafer removed and the remaining polymer adhesive removed. The remaining portion of the device wafer with the through-hole vias may then be bonded to another wafer or sandwiched between two wafers for providing additional circuitry in a 3-D module. The modules are then singulated, such as by sawing, and the tape is then stretched to separate the modules in preparation for the modules to be packaged.

FIG. 7 illustrates the remaining portion of the device wafer 10a after the removal of the de-bonded carrier wafer 30 and the remaining adhesive 32. The remaining material may be removed by an etchant, plasma, or dissolving solution provided by the manufacturer of the adhesive 32, to expose the electrodes 28. An HT1010™ adhesive can be cleaned easily with a standard HT1010 de-bond remover from Brewer Science. For higher temperature adhesives, such as BCB or PBO, an O2/SF6 (for BCB) or O2 (for PBO) plasma etch has been used with good results.

The electrodes 28 of the resulting device wafer 10a may then be bonded to aligned electrodes on another wafer 50 or sandwiched between two wafers, where each wafer may provide additional circuitry in a 3-D module. The aligned wafer electrodes may be bonded by ultrasonic bonding under pressure, or by gold balls, or by solder, etc. The modules are then singulated, such as by sawing, laser singulation, water jet cutting, etc., and the tape 42 is then X-Y stretched to separate the modules in preparation for the modules to be packaged or mounted on another wafer or a printed circuit board. The dashed line 48 illustrates one possible singulation line.

In one embodiment, the device wafer 10a of FIG. 7 contains TVS circuitry, such as back-to-back diodes, and/or control circuitry, and the wafer 50 is the LED wafer shown in FIG. 1, so that each LED is protected by associated TVS circuitry. The TVS circuitry provides a virtual short circuit across the LEDs to protect them when there is a sufficiently high reverse voltage across the LEDs. The resulting modules, after singulation, may then be mounted on another wafer containing integrated circuitry or on a submount wafer. The submount wafer may be ceramic with electrodes for contacting the electrodes 38 of the device wafer 10a, where the submount electrodes lead to metal pads for bonding to a printed circuit board (PCB).

Alternatively, the bonded wafer structure may be mounted on a vacuum chuck, prior to the tape 42 being applied, for cleaning the device wafer 10a after the carrier wafer 30 has been de-bonded. After cleaning, the tape 42 is affixed to the cleaned surface.

FIGS. 8-12 illustrate a double bonding method where device wafer 10 is sandwiched between two wafers.

Figure 8:
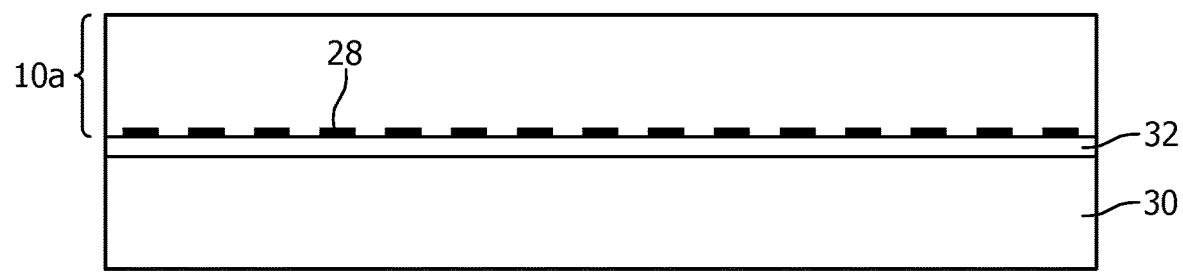
FIGS. 8-12 illustrate a double bonding method where the device wafer is sandwiched between two wafers.

FIG. 8 is similar to FIG. 2, where a transparent carrier wafer 30 is bonded to the device wafer 10 using a polymer adhesive 32. The device wafer 10 may be an LED wafer or any IC wafer.

Figure 9:
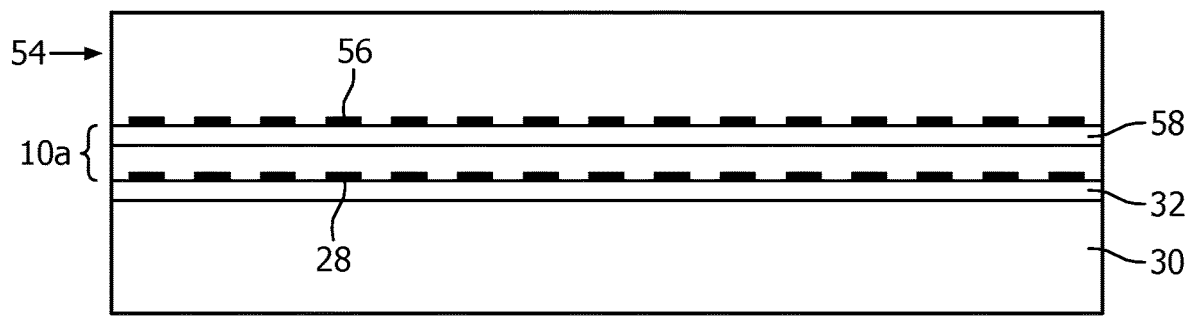
Figure 10:

FIG. 9 illustrates the device wafer 10a after removal of its growth substrate 12 (FIG. 1) (if appropriate), and the device wafer 10a being further processed (e.g., thinned). A second device wafer 54, such as an LED wafer or any IC wafer, having electrodes 56, is bonded to the device wafer 10a by an adhesive 58. Unlike the adhesive 32, which absorbs the laser beam energy for de-bonding, the adhesive 58 is intended to be permanent. In one embodiment, the adhesive 58 is a very high temperature polymer (e.g., >300° C.) so as to be unaffected by downstream high temperature processes.

FIG. 10*a*, as in FIG. 6, illustrates a laser 44 generating a laser beam 46 scanning (or stepping) through the transparent carrier wafer 30. As described with respect to FIG. 6, the beam energy is absorbed by the adhesive 32 but not the carrier wafer 30. The absorbed energy breaks the chemical bonds between the polymer adhesive 32 and the carrier wafer 30. The released carrier wafer 30 is then lifted off the device wafer 10*a*.

Figure 11:

FIG. 11 illustrates the de-bonded carrier wafer 30 removed from the device wafer 10*a* and the remaining adhesive 32 removed to expose the electrodes 28.

Figure 12:
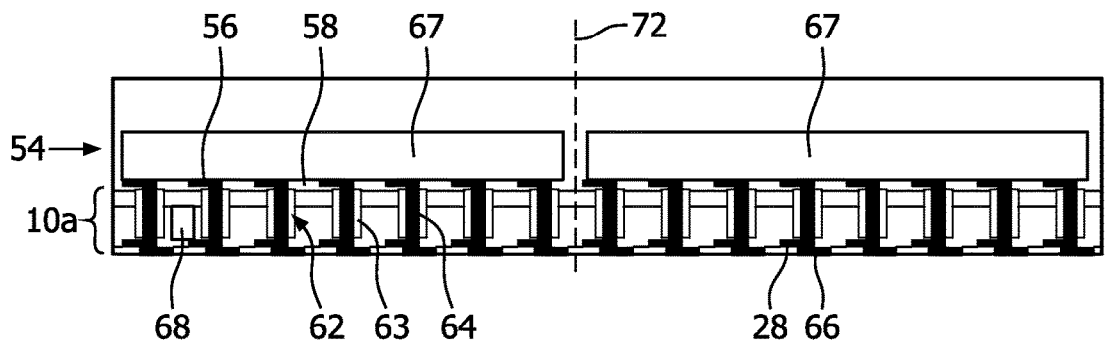

FIG. 12, as in FIG. 4, illustrates via holes 62 etched through the remaining device wafer 10*a* and the adhesive 58 using RIE or other means. The via holes 62 are then coated with a dielectric 63 (if the device wafer 10*a* body is not an insulating material) using well-known processes, and the via holes 62 are then filled with a conductive material 64. A metal electrode layer is then deposited and patterned over the exposed surface to form electrodes 66 contacting the conductive material 64 and/or the electrodes 28. The electrodes 66 may comprise gold or any suitable alloy. Thus, a conductive path is formed between the electrodes 56 of the second device wafer 54 and the "bottom" electrodes 28 of the device wafer 10*a*.

In one embodiment, the second device wafer 54 contains active control circuitry 67 for controlling LEDs, the device wafer 10*a* contains TVS circuitry 68 (only one TVS circuit 68 is shown connected to the electrodes 66 for simplicity), and the LED wafer electrodes 20 and 22 (for each LED) of FIG. 1 are bonded to the electrodes 28 of the device wafer 10*a*. The control circuitry 67 and TVS circuitry 68 may be otherwise conventional. The second device wafer 54 may itself have through-hole vias terminating in pads for bonding to a PCB. Alternatively, after singulation, the electrodes 66 are bonded to pads of a PCB, and the device wafer 10*a* acts as an interface between the PCB pads and the second device wafer 54. In conventional LED systems, the control circuitry is provided as a separate chip on a PCB electrically connected to the LEDs by traces on the PCB. The 3-D module combining the LEDs and control circuitry on a single die allows for extremely compact applications, such as the use of the module as a flash in a smart phone camera.

In another embodiment, the LED wafer of FIG. 1 is the second device wafer 54, the device wafer 10*a* contains TVS circuitry and/or control circuitry for the LEDs, and the electrodes 66 are bonded to pads of a PCB for providing power and control signals for the LEDs. Many other variations of circuitry are envisioned. The device wafers 10*a* and 54 may include active circuitry (transistors, diodes, etc.), passive circuitry (conductors, resistors, capacitors, etc.), or any other circuitry.

The resulting 3-D wafer may be singulated along line 72 to form 3-D module dies for packaging.

Figure 13:
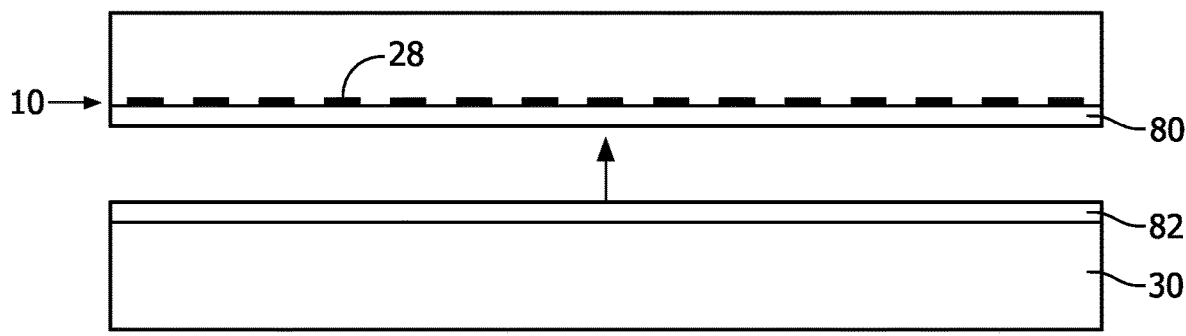
FIGS. 13-15 illustrate the use of a metal-metal bond between the device wafer and the carrier wafer.
Figure 14:
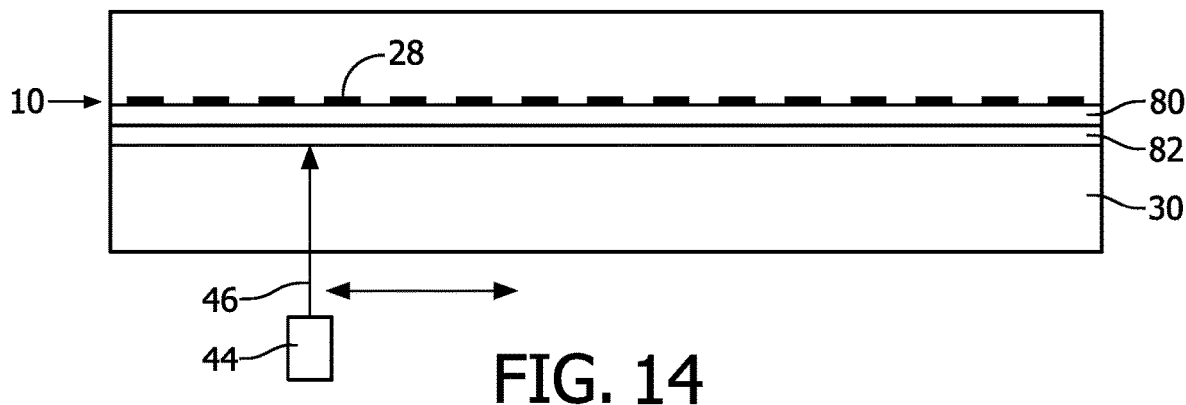
Figure 15:

FIGS. 13-15 illustrate the use of a metal-metal bond between the device wafer and the carrier wafer.

FIG. 13 illustrates a first metal layer 80 (such as a eutectic alloy) deposited on the device wafer 10*a* by, for example, sputtering. The metal layer 80 may be gold or a suitable eutectic alloy. The bond need not be strong.

A second metal layer 82 (such as a eutectic alloy) is deposited on the transparent carrier wafer 30 by, for example, sputtering. The metal layers 80 and 82 may have the same composition. The metal bonds to the wafers need not be strong.

Suitable metals and alloys include combinations of Au, Cu, Ag, Al, Sn, SiGe, and Si.

The metal layers 80 and 82 are then bonded together using heat and pressure, such as by ultrasonic welding or externally applied heat. The metal-metal bond can withstand higher temperatures than available polymer adhesives, so the process of FIGS. 13-15 is particularly suitable when very high temperature processes (>400° C.) need to be performed on the device wafer 10*a*.

FIG. 14 illustrates a laser beam 46 scanning through the carrier wafer 30 to break the bonds between the deposited metal layer 82 and the carrier wafer 30. The bonds between metal and a sapphire carrier wafer 30 are easily broken.

FIG. 15 illustrates the device wafer 10*a* after the carrier wafer 30 has been removed. The remaining metal layers 80 and 82 are then etched from the device wafer 10*a* or removed by other means. In some cases, the metal layers 80 and 82 are retained as electrodes or a reflector layer.

The device wafer 10*a* is then singulated, as previously described.

The de-bonding technique may also be applied to other types of bonding techniques/materials, such as anodic bonding, fusion bonding, frit glass bonding, etc.

While particular embodiments of the present invention have been shown and described, it will be obvious to those skilled in the art that changes and modifications may be made without departing from this invention in its broader aspects. The appended claims are to encompass within their scope all such changes and modifications as fall within the true spirit and scope of this invention.

What is claimed is:

1. A method for forming an electrical structure comprising:
   providing a device wafer comprising a first metal layer;
   providing a carrier wafer having a first surface bonded to a second metal layer;
   bonding the first metal layer to the second metal layer to form a bonded metal layer between the carrier wafer and the device wafer
   emitting light through the carrier wafer to impinge on the first surface of the carrier wafer such that bonds between the bonded metal layer and the first surface of the carrier wafer are de-bonded; and
   removing the carrier wafer from the bonded metal layer.

2. The method of claim 1, wherein a wavelength of the light is in a range from approximately ultraviolet (UV) wavelengths and blue wavelengths.

3. The method of claim 1, wherein the carrier wafer comprises sapphire.

4. The method of claim 1, wherein the carrier wafer comprises SiC.

5. The method of claim 1, further comprising:
   processing a side of the device wafer opposite the first metal layer while the carrier wafer is joined to the device wafer.

6. The method of claim 5, further comprising:
   bonding an additional device wafer to the device wafer, such that one or more conductive vias in the device wafer are in contact with electrodes on the additional device wafer.

7. The method of claim 6, further comprising providing one or more light emitting diodes (LEDs) via the additional device wafer.

8. The method of claim 7, further comprising providing transient voltage suppression (TVS) circuitry for the one or more LEDs.

9. The method of claim 1, further comprising providing one or more light emitting diodes (LEDs) via the device wafer.

10. The method of claim 1, further comprising:
removing the bonded metal layer from the first surface of the device wafer.

11. The method of claim 1, further comprising:
removing one or more portions of the bonded metal layer to form electrodes on the first surface of the device wafer.

12. The method of claim 1, wherein a wavelength of the light is approximately 193 nm.

13. The method of claim 1, wherein the light has an intensity of approximately 800 mJ/cm$^2$.

14. The method of claim 1, wherein the bonds between the bonded metal layer and the first surface of the carrier wafer are formed by a benzocyclobutene (BCB) polymer adhesive.

15. A method for forming an electrical structure comprising:
forming a first metal layer on a first side of a device wafer;
forming a second metal layer on a first side of a carrier wafer;
joining the carrier wafer to the device wafer by bonding the first metal layer to the second metal layer to create a single bonded metal layer with a first surface of the bonded metal layer in contact with the first side of the device wafer and a second surface of the bonded metal layer in contact with the first side of the carrier wafer;
emitting a light from the light source through the carrier wafer to impinge on the second surface of the bonded metal layer and de-bond bonds between the bonded metal layer and the carrier wafer; and
removing the carrier wafer from the bonded metal layer.

16. The method of claim 15 further comprising processing a second side of the device wafer, opposite the first side, while the carrier wafer is joined to the device wafer.

* * * * *